US008059481B2

(12) United States Patent
Kobayashi

(10) Patent No.: US 8,059,481 B2

(45) Date of Patent: Nov. 15, 2011

(54) SEMICONDUCTOR MEMORY DEVICE

(75) Inventor: Tomohiro Kobayashi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 232 days.

(21) Appl. No.: 12/555,029

(22) Filed: Sep. 8, 2009

(65) Prior Publication Data

US 2010/0097866 A1 Apr. 22, 2010

(30) Foreign Application Priority Data

Oct. 16, 2008 (JP) ................................ 2008-267610

(51) Int. Cl.
*G11C 7/02* (2006.01)
*G11C 7/06* (2006.01)

(52) U.S. Cl. ................................ 365/210.1; 365/189.07

(58) Field of Classification Search ............... 365/210.1, 365/189.07, 207, 203
See application file for complete search history.

(56) References Cited

U.S. PATENT DOCUMENTS 6,069,831 A * 5/2000 Jang et al. ................ 365/189.07
2003/0202412 A1* 10/2003 Nii et al. ........................ 365/210
2004/0042275 A1* 3/2004 Yoshizawa et al. ...... 365/189.07

FOREIGN PATENT DOCUMENTS

JP 06-036586 2/1994

OTHER PUBLICATIONS

Fackenthal et al, A 3.3V 16Mbit DRAM-Compatible Flash Memory, Symposium on VLSI Circuit Digest of Technical Papers, Jun. 1995, pp. 62-68.

* cited by examiner

*Primary Examiner* — Anh Phung
(74) *Attorney, Agent, or Firm* — Turocy & Watson, LLP

(57) ABSTRACT

A semiconductor memory device includes a memory cell array provided with a main memory cell array including a plurality of memory cells, and a dummy column including a plurality of dummy memory cells, a dummy readout current control section configured to control a current value of a dummy readout current of the dummy memory cell in such a manner that the current value becomes between the current values of the readout currents in first and second states of the memory cell, and a sense section provided with a sense amplifier configured to receive a readout current in one of the first and second states, or dummy readout current as an input, comparing these currents with each other, and outputting the currents.

16 Claims, 11 Drawing Sheets

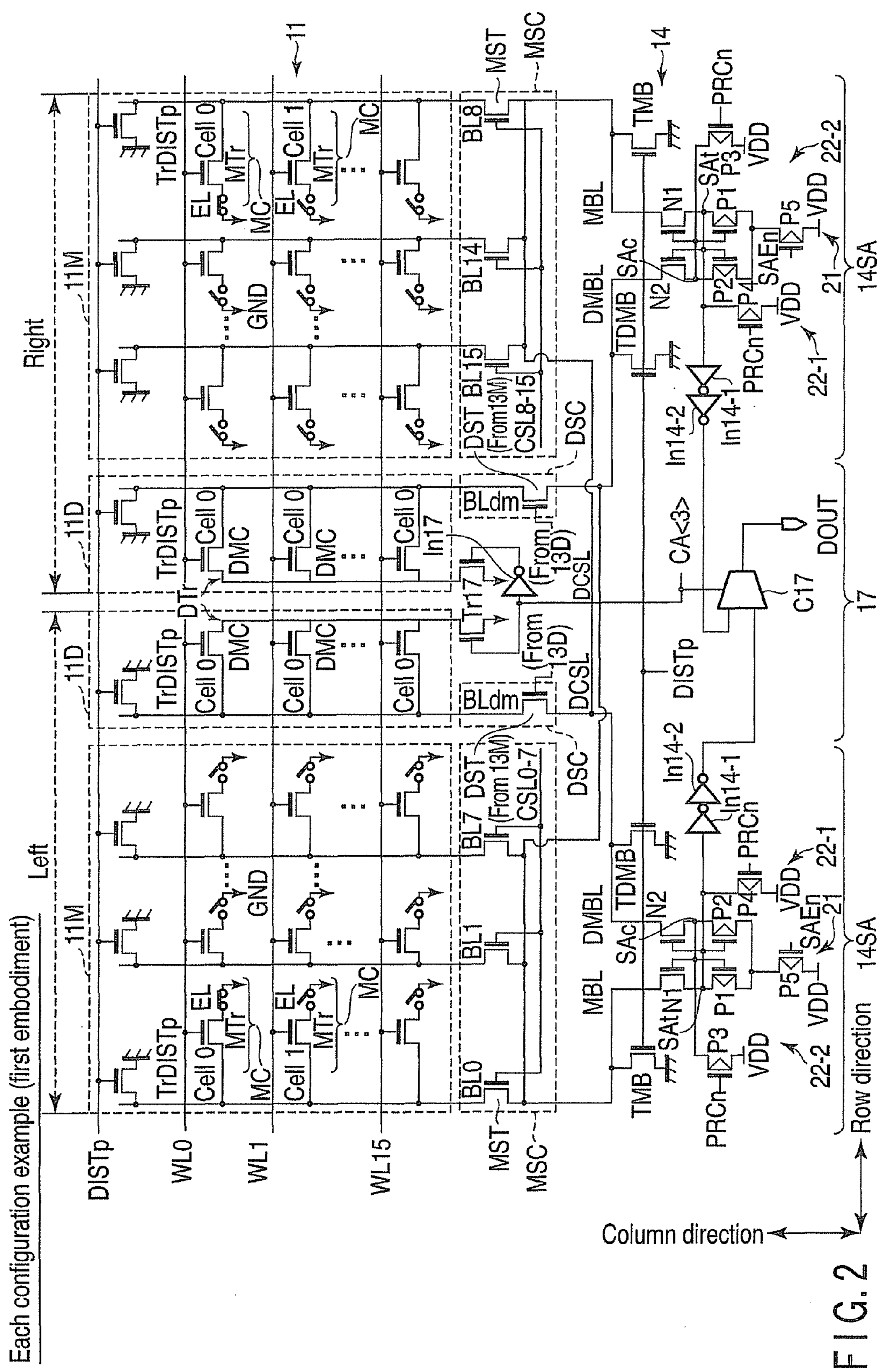
F I G. 2

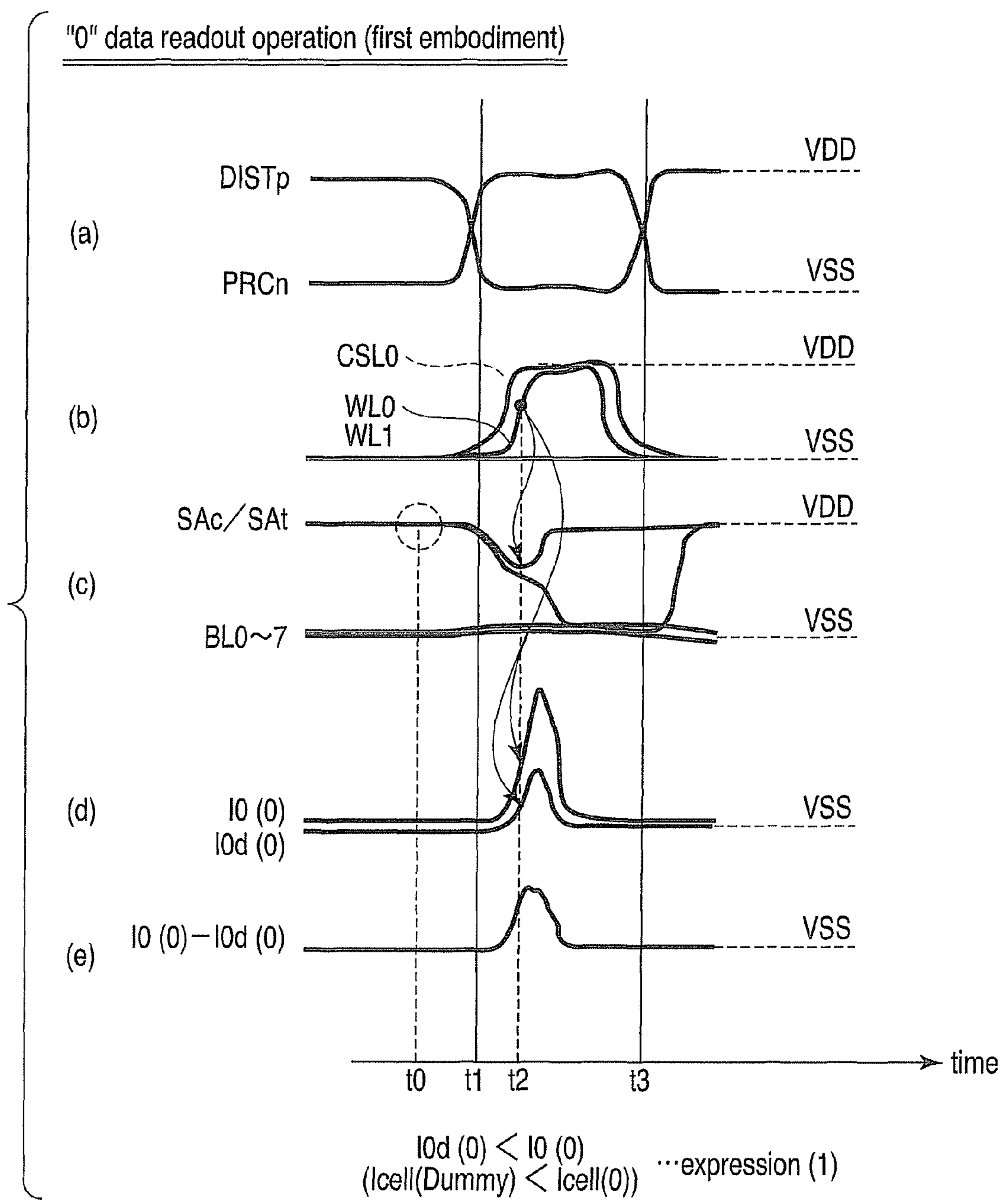
F I G. 3

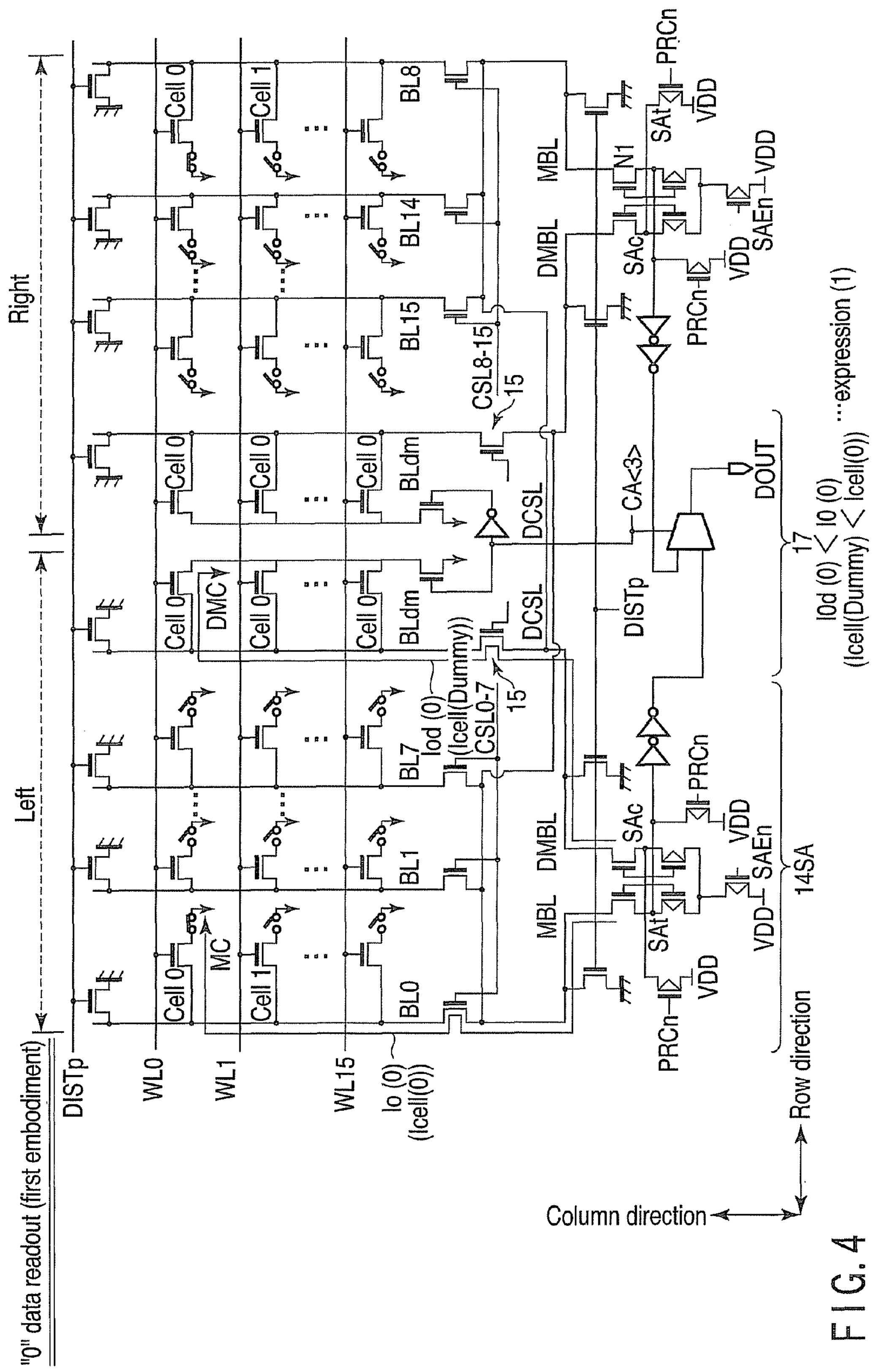
F I G. 4

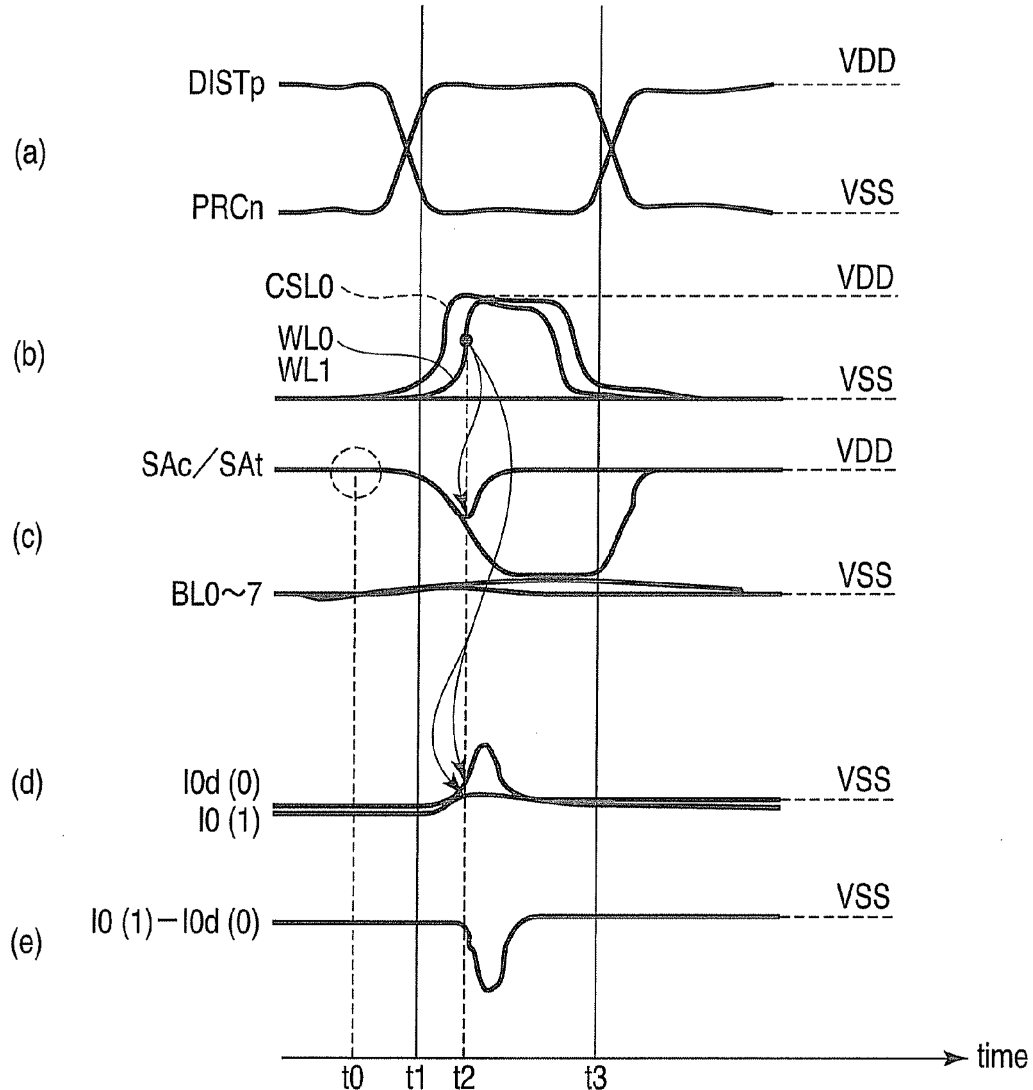
F I G. 5

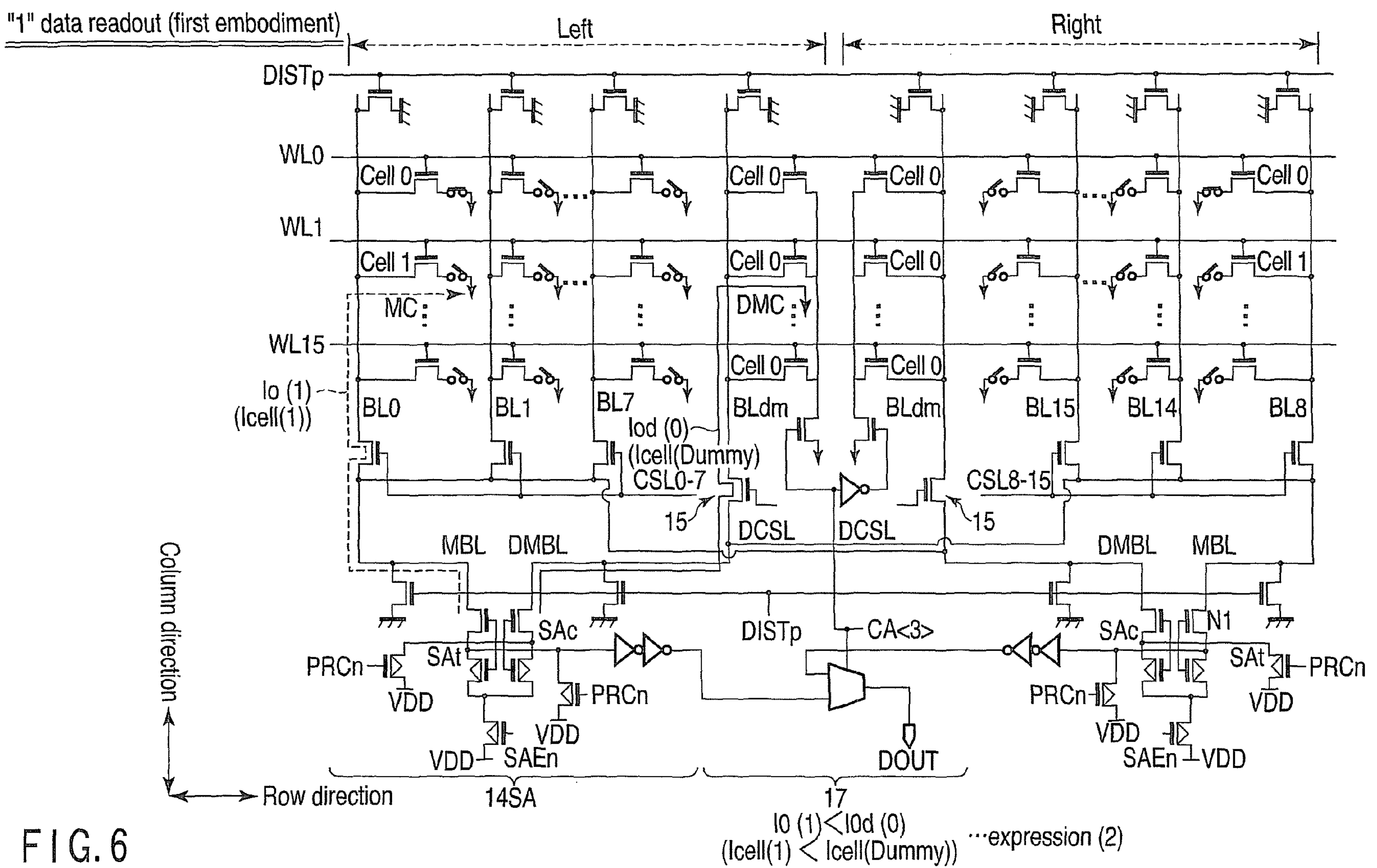
F I G. 6

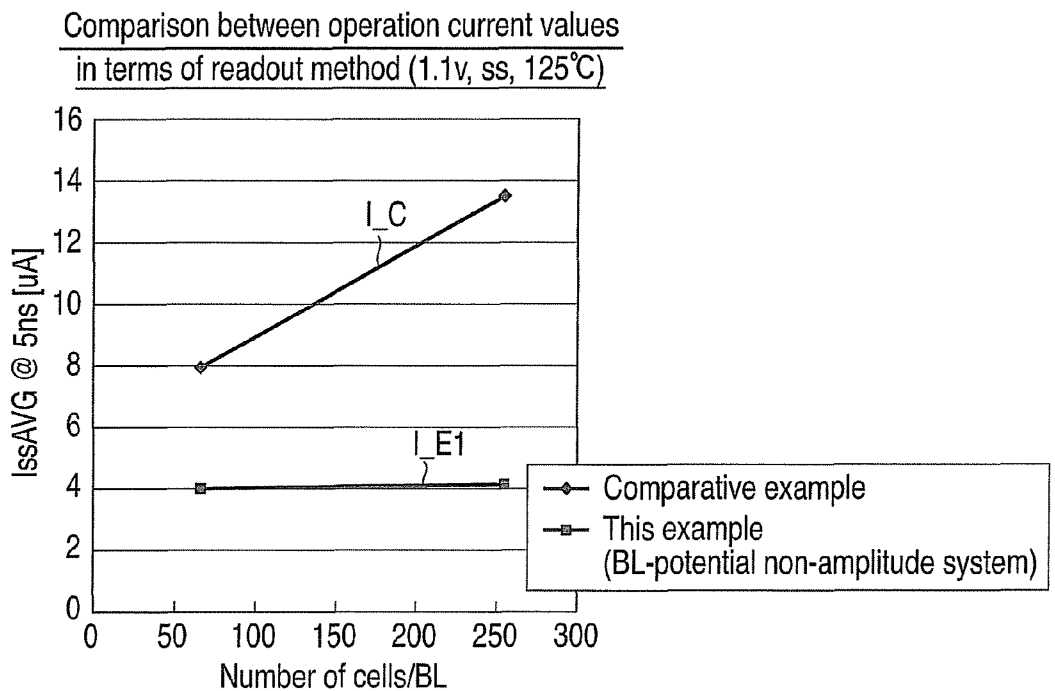
F I G. 7
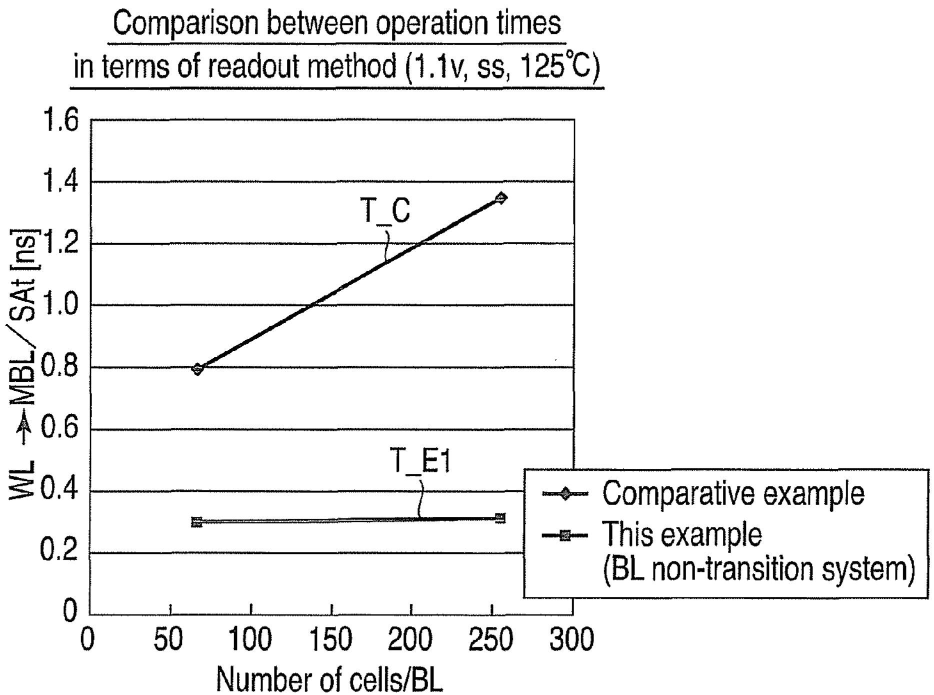
F I G. 8

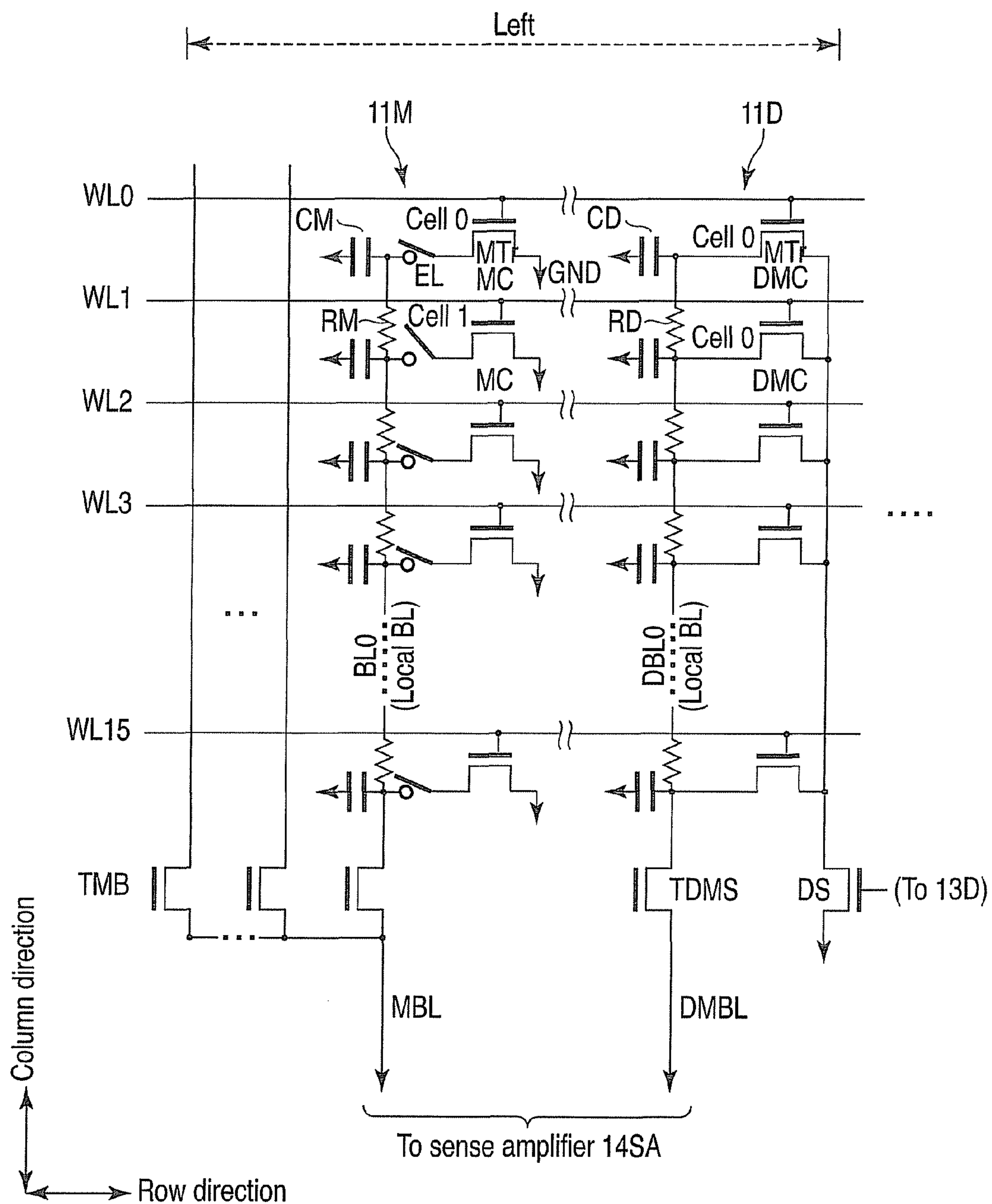
F I G. 9

Data readout operation (second embodiment)
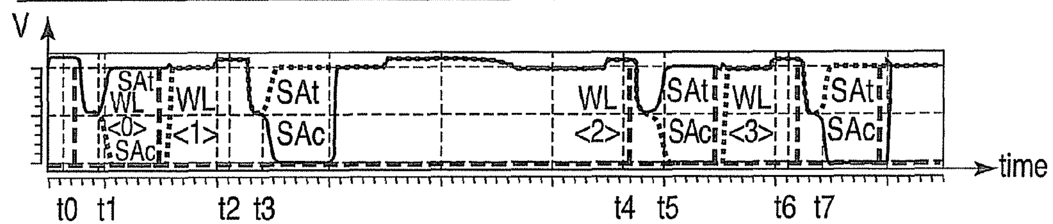
F I G. 10
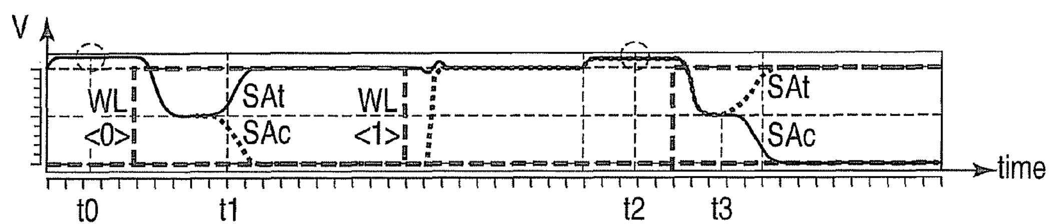
F I G. 11
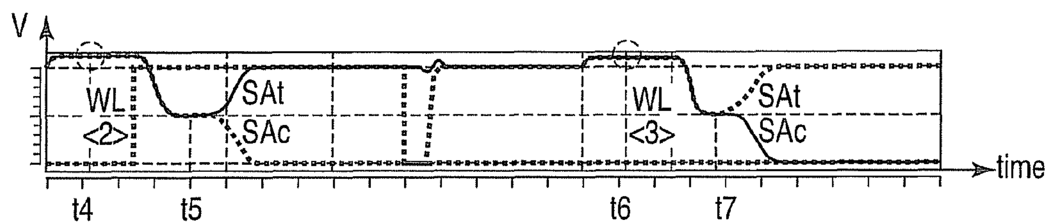
F I G. 12
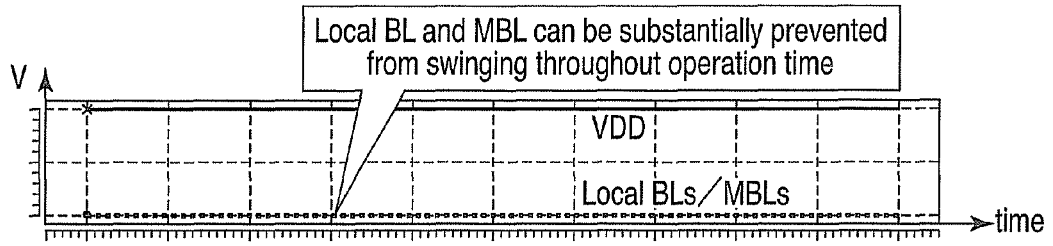
F I G. 13

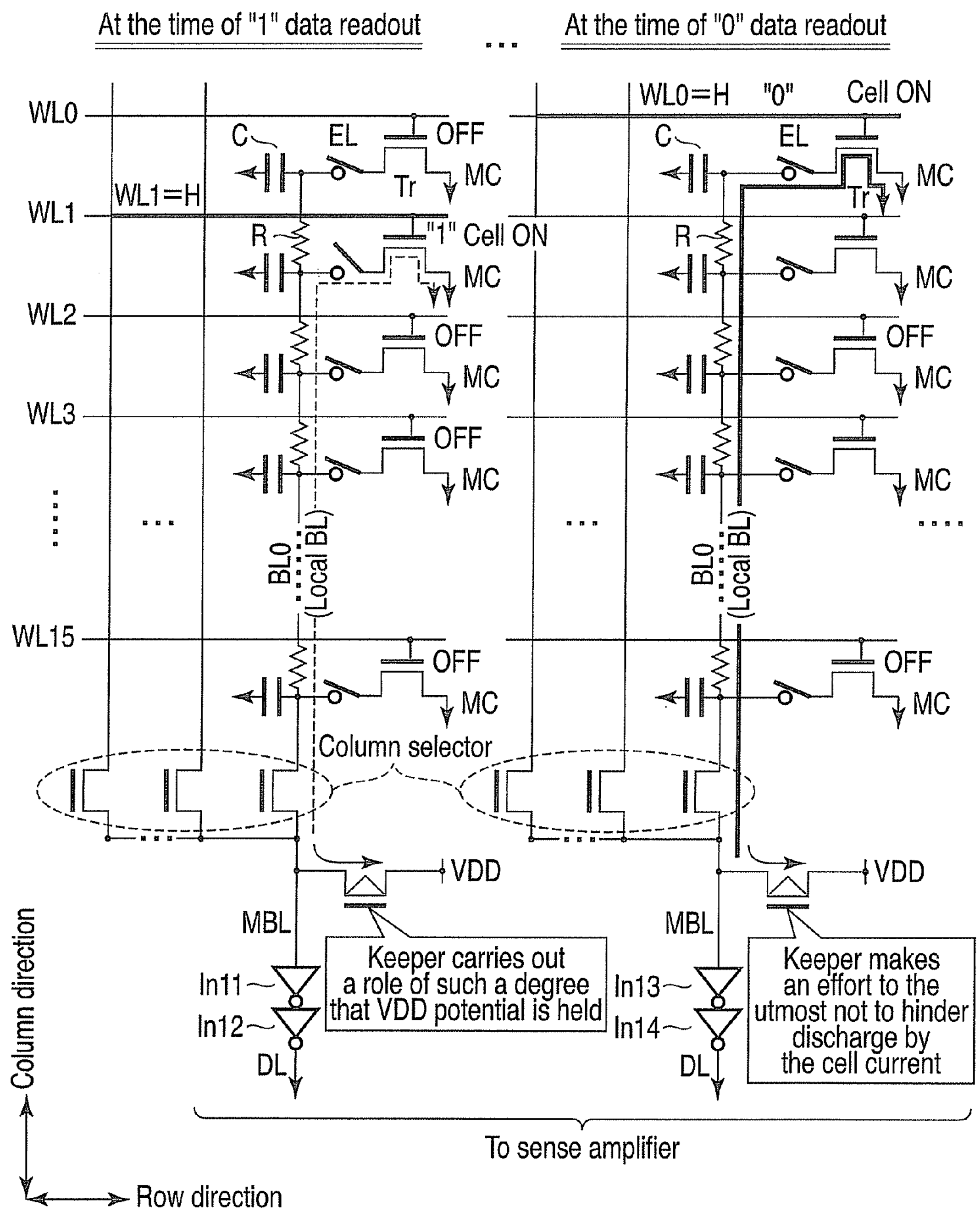
F I G. 14

"1"/"0" data readout operation (comparative example)

SEMICONDUCTOR MEMORY DEVICE

CROSS-REFERENCE TO RELATED APPLICATIONS

This application is based upon and claims the benefit of priority from prior Japanese Patent Application No. 2008-267610, filed Oct. 16, 2008, the entire contents of which are incorporated herein by reference.

BACKGROUND OF THE INVENTION

1. Field of the Invention

The present invention relates to a semiconductor memory device, which is applied to, for example, a Read Only Memory (ROM), and the like.

2. Description of the Related Art

As for, for example, a Read Only Memory (ROM) among semiconductor memory devices, in a memory cell array thereof, ROM cells are arranged at intersection positions of a plurality of word lines and bit lines as memory cells.

At the time of a data readout operation, a bit line is first pre-charged to a predetermined voltage level. Subsequently, the selected bit line is discharged for a predetermined period of time, and a voltage of the selected bit line is determined, whereby the data of the memory cell is read (for example, Jpn. Pat. Appln. KOKAI Publication No. 6-36586).

BRIEF SUMMARY OF THE INVENTION

A semiconductor memory device according to an aspect of the present invention comprising a memory cell array provided with a main memory cell array including a plurality of memory cells, and a dummy column including a plurality of dummy memory cells; a dummy readout current control section configured to control a current value of a dummy readout current of the dummy memory cell in such a manner that the current value becomes between the current values of the readout currents in first and second states of the memory cell; and a sense section provided with a sense amplifier configured to receive a readout current in one of the first and second states, or dummy readout current as an input, comparing these currents with each other, and outputting the currents.

A semiconductor memory device according to an aspect of the present invention comprising a memory cell array provided with a main memory cell array including a plurality of memory cells arranged at intersection positions of a plurality of word lines and a plurality of bit lines, and a dummy column including a plurality of dummy memory cells arranged at intersection positions of the plurality of word lines and a plurality of dummy bit lines; a dummy readout current control section configured to control a current value of a dummy readout current of the dummy memory cell in such a manner that the current value becomes between the current values of the readout currents in first and second states of the memory cell; and a sense section provided with a sense amplifier configured to receive a readout current in one of the first and second states, or dummy readout current as an input, comparing these currents with each other, and outputting the currents, wherein the memory cell is constituted of a transistor a gate of which is connected to a word line, a drain of which is connected to a bit line through an element with two terminals, and a source of which is connected to a reference power source, and the case where the two terminals of the element are short-circuited is defined as the first state, and a readout current in the case where a part between the two terminals of the element is opened is defined as a readout current in the second state.

BRIEF DESCRIPTION OF THE SEVERAL VIEWS OF THE DRAWING

FIG. 2 is an equivalent circuit diagram showing a memory cell array and sense section in FIG. 1;

FIG. 3 is a timing chart showing a "0" data readout operation according to the first embodiment;

FIG. 4 is an equivalent circuit diagram for explaining the "0" data readout operation according to the first embodiment;

FIG. 5 is a timing chart showing a "1" data readout operation according to the first embodiment;

FIG. 6 is an equivalent circuit diagram for explaining the "1" data readout operation according to the first embodiment;

FIG. 7 is a view showing a relationship between the number of cells per bit line and current value in each of the first embodiment and a comparative example;

FIG. 8 is a view showing a relationship between the number of cells per bit line and operation time in each of the first embodiment and the comparative example;

FIG. 9 is an equivalent circuit diagram showing a memory cell array according to a second embodiment;

FIG. 10 is a timing chart showing a data readout operation according to the second embodiment;

FIG. 11 is a timing chart for explaining a "0" readout operation according to the second embodiment;

FIG. 12 is a timing chart for explaining a "1" readout operation according to the second embodiment;

FIG. 13 is a timing chart showing a bit line voltage at the time of the readout operation according to the second embodiment;

FIG. 14 is an equivalent circuit diagram showing a semiconductor memory device according to a comparative example.

DETAILED DESCRIPTION OF THE INVENTION

In the configuration and data readout operation according to a comparative example to be described later, it is necessary to read data by discharging a pre-charged selected bit line. Accordingly, data readout is carried out by using a current of a memory cell after activating the wiring capacitance of the bit line (for example, junction capacitance of a transistor, wiring capacitance of a local bit line, and wiring capacitance of a main bit line). As a result of this, the charging time and discharging time of the wiring capacitance of the bit line become necessary, whereby a tendency toward disadvantage to the high-speed operation is caused.

It should be noted that as described above, there is also a tendency toward larger power consumption due to the point that it is necessary to activate the wiring capacitance of the bit line (for example, junction capacitance of a transistor, wiring capacitance of a local bit line, and wiring capacitance of a main bit line).

Thus, embodiments of the present invention will be described below with reference to the accompanying drawings. It should be noted that in the description, parts which are common throughout all the drawings are denoted by common reference symbols.

First Embodiment

A semiconductor memory device, and data readout operation thereof according to a first embodiment of the present invention will be described below by using FIGS. 1 to 8. In this description, description will be given by employing a Read Only Memory (ROM) as an example.

1. Configuration Example

1-1. Overall Configuration Example

First, an overall configuration example of a semiconductor memory device according to the first embodiment will be described below by using FIG. 1. Here, in the configuration of this example, the left side region Left, and right side region Right are arranged mirror-symmetric with respect to a data output section 17 of a sense section 14 serving as a center, except for a row decoder. The circuit configurations arranged mirror-symmetric and their operations are equal to each other, and hence description of overlapped parts will be omitted in the following.

Figure 1:
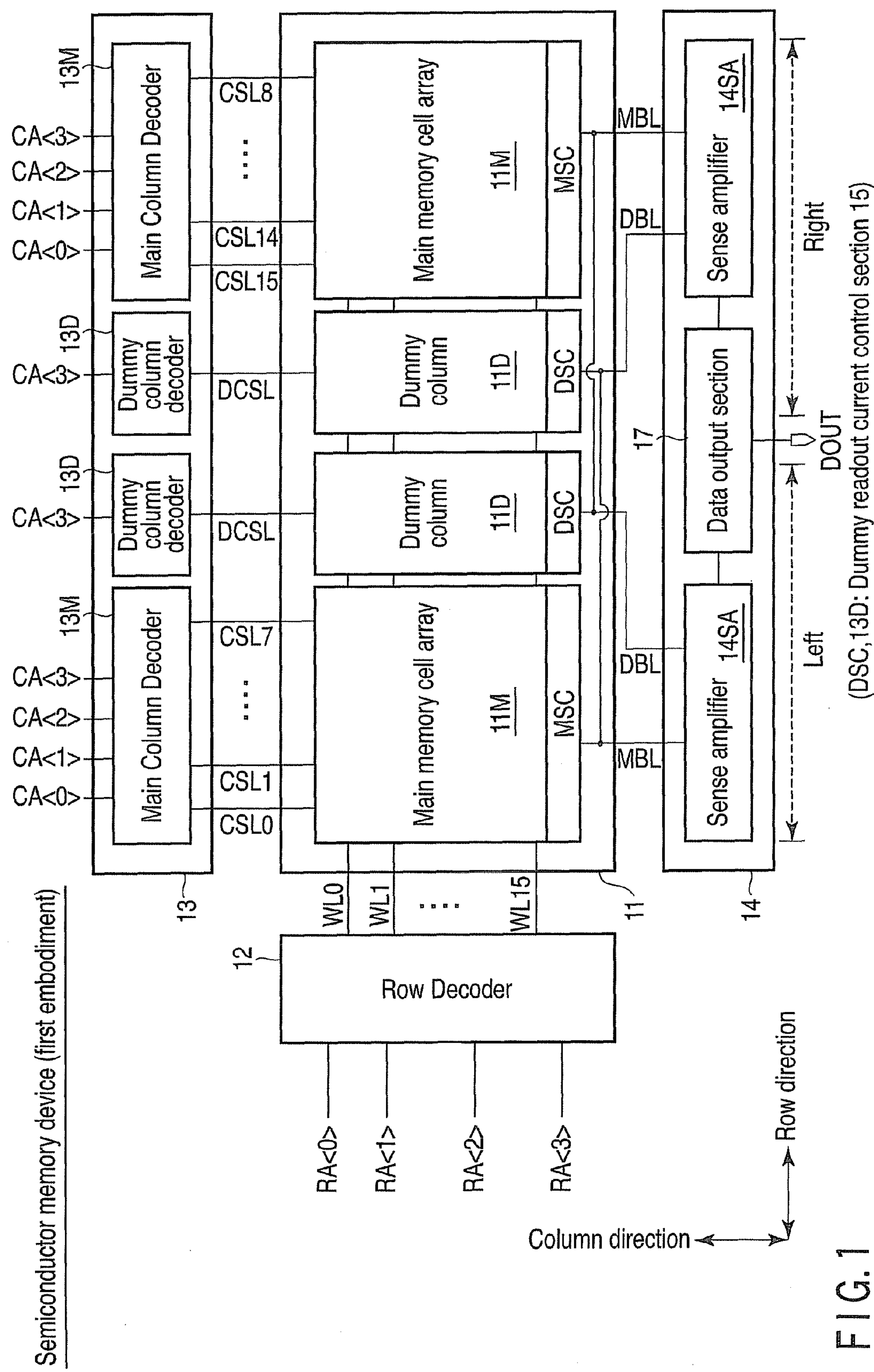
FIG. 1 is a block diagram showing an example of the overall configuration of a semiconductor memory device according to a first embodiment of the present invention.

As shown in FIG. 1, the semiconductor memory device according to this example is provided with a memory cell array 11, row decoder 12, column decoder 13, and sense section 14.

The memory cell array 11 is provided with a main memory cell array 11M, dummy column 11D, main column selection section MSC, and dummy column selection section DSC.

The main memory cell array 11M includes a plurality of memory cells (not shown) arranged in a matrix form at intersection positions of a plurality of word lines (WL0 to WL15) and a plurality of bit lines. The dummy column 11D includes a plurality of dummy memory cells (not shown) arranged at intersection positions of a plurality of word lines (WL0 to WL15) and dummy bit lines. The main column selection section MSC selects a column of the main memory cell array 11M. The dummy column selection section DSC selects a column of the dummy column 11D. Here, the dummy column selection section DSC operates together with a dummy column decoder 13D to be described later as a dummy readout current control section 15.

The row decoder 12 decodes an input row address RA<0:3>, and selects one of the word lines WL0 to WL15 of each of the memory cell array 11M and dummy column 11D.

The column decoder 13 is provided with a main column decoder 13M, and dummy column decoder 13D.

The main column decoder 13M decodes an input column address CA<0:3>, and outputs a main selection signal CSL0 to CSL15 configured to select a bit line to the main column selection section MSC. Each of the left side and right side main column decoders 13M is configured in such a manner that a column address CA<0>CA<1>CA<2>CA<3> is input to each of them.

More specifically, a column selected by decoding of a signal level in each of lower 8 states from CA<0>=L, CA<1>=L, CA<2>=L, CA<3>=L to CA<0>=H, CA<1>=H, CA<2>=H, CA<3>=L is assigned to the left side main column decoder 13M. A column selected by decoding of a signal level in each of upper 8 states from CA<0>=L, CA<1>=L, CA<2>=L, CA<3>=H to CA<0>=H, CA<1>=H, CA<2>=H, CA<3>=H is assigned to the right side main column decoder 13M.

The dummy column decoder 13D decodes an input dummy column address CA<3>, and outputs a dummy selection signal DCSL0 configured to select a dummy bit line to the dummy column selection section DSC. This dummy column decoder 13D operates together with the dummy column selection section DSC as a dummy readout current control section 15. More specifically, the dummy column decoder 13D outputs a dummy selection signal DCS for controlling the current value of the dummy readout current, at the time of a data readout operation, in such a manner that the current value becomes between the current values of the readout currents in the state "1" and state "0" of the memory cell (Icell(1)<Icell(Dummy)<Icell(0)) to the dummy column selection section DSC. The dummy column selection section DSC receives the dummy selection signal DCS, and narrows down the dummy readout current to satisfy the above relationship.

The sense section 14 is provided with a sense amplifier 14SA, and data output section 17.

When the sense amplifier 14SA is connected to the main bit line, a readout current of the state "1" or state "0" is input to the sense amplifier 14SA, and when the sense amplifier 14SA is connected to the dummy bit line DBL, a dummy readout current is input thereto. The sense amplifier 14SA compares these two input currents with each other, and outputs the currents.

In the data output section 17, the input thereof is connected to the sense amplifier 14SA, and the output thereof is connected to an output terminal. The data output section 17 outputs readout data from one of the sense amplifiers 14SA of the left side region Left, and right side region Right to the outside as output data DOUT.

1-2. Configuration Examples of Memory Cell Array, Sense Section, and Data Output Section Next, a configuration example of each of the memory cell array 11, and sense section 14 in FIG. 1 will be described below by using FIG. 2.

1-2-1. Regarding Memory Cell Array

As shown in FIG. 2, the main memory cell array 11M constituting the memory cell array 11 includes a plurality of memory cells MC arranged at intersection positions of a plurality of word lines (WL0 to WL15), and a plurality of bit lines (BL0 to BL15) in a matrix form, and block selection transistors TrDISTp.

The memory cell MC is constituted of a memory transistor MTr, and element EL with two terminals. A gate of the memory transistor MTr is connected to one of the word lines (WL0 to WL15), and drain thereof is connected to one of the bit lines (BL0 to BL15). In the element EL, one end thereof is connected to a source of the memory transistor MTr, and the other end thereof is connected to the ground potential (GND). Here, the readout current of the memory cell MC in the case where the two terminals of the element EL are short-circuited is defined as a readout current in the state "0" (first state), and that in the case where the part between the two terminals of the element EL is opened is defined as a readout current in the state "1" (second state). Further, in FIG. 2, a memory cell MC in which a readout current in the state "0" is stored is expressed as a cell 0, and a memory cell MC in which a readout current in the state "1" is stored is expressed as a cell 1. It should be noted that the element EL shown in FIG. 2 is an element which is built in, in the same manner as the memory transistor Tr, in accordance with presence/absence (white/black) of VIA mask data, and in which the connection state of the two terminals is irreversible.

A gate of the block selection transistor TrDISTp is connected to the block selection signal line DISTp, drain thereof is connected to one of the bit lines (BL0 to BL15), and drain thereof is grounded.

The dummy column 11D includes a plurality of dummy memory cells DMC arranged at intersection positions of the plurality of word lines (WL0 to WL15) and dummy bit lines (BLdm), and a block selection transistor TrDISTp. The dummy memory cell DMC is of the same configuration as the memory cell MC, and is configured in such a manner that the two terminals of the element EL are short-circuited. That is, the dummy memory cell DMC is constituted of a dummy transistor DTr, and element EL (illustration thereof is omitted here). A gate of the dummy transistor DTr is connected to one of the word lines (wL0 to WL15), and drain thereof is connected to the dummy bit line BLdm. Likewise, in the element EL illustration of which is omitted, one end is connected to a source of the dummy memory transistor DTr, and the other end is connected to the ground potential (GND). As a result of this, a readout current of the dummy memory cell DMC is, at all times, a readout current (Icell(Dummy)) in the state "0" of the case where the two terminal of the element EL are short-circuited. In FIG. 2, a dummy memory cell DMC in which a readout current in the state "0" is stored is expressed as a cell 0. Further, the dummy memory column 11D including the dummy memory cells DMC is formed simultaneously with the main memory cell array 11M by the manufacturing process common to both the main memory cell array 11M and the dummy memory column 11D.

The main column selection section MSC is constituted of main selection transistors MST. A gate of the main selection transistor MST is connected to one of column selection signals (CSL0 to CSL15) output from the main column decoder 13M, an end of a current path thereof is connected to the main memory cell array 11M, and the other end of the current path is connected to the sense amplifier 14SA through the main bit line MBL.

The dummy column selection section DSC is constituted of a dummy selection transistor DST. A gate of the dummy selection transistor DST is connected to a dummy selection signal (DCSL) output from the dummy column decoder 13D, one end of a current path thereof is connected the dummy column 11D, and the other end of the current path is connected to the sense amplifier 14SA through the dummy bit line DMBL. As described above, the dummy column selection section DSC operates together with the dummy column decoder 13D as the dummy readout current control section 15.

1-2-2. Regarding Sense Section

As shown in FIG. 2, the sense amplifier 14SA constituting the sense section 14 is constituted of a data latch section 21, pre-charge sections 22-1 and 22-2, and inverters IN14-1 and IN14-2.

The data latch section 21 is configured to include n-type transistors N1 and N2, p-type transistors P1, P2, and P5. A gate of the n-type transistor N1 is connected to a second latch node SAc to which a dummy readout current is input, and source thereof is connected to the main bit line MBL. A gate of the n-type transistor N2 is connected to a first latch node SAt to which a readout current is input, and source thereof is connected to the dummy bit line DMBL. A gate of the p-type transistor P1 is connected to the gate of the n-type transistor N1, and drain thereof is connected to the source of the transistor N1. A gate of the p-type transistor P2 is connected to the gate of the n-type transistor N2, and drain thereof is connected to the source of the transistor N2. A gate of the p-type transistor P5 is connected to a sense amplifier selection signal SAEn, drain thereof is connected to sources of the transistors P1 and P2, and source thereof is connected to an internal power source VDD.

The first pre-charge section 22-1 is constituted of a p-type transistor P4, and pre-charges the first latch node SAt at the time of a data readout operation. A gate of the p-type transistor P4 is connected to a pre-charge section selection signal PRCn, drain thereof is connected to the first latch node SAt, and source thereof is connected to the internal power source VDD.

The second pre-charge section 22-2 is constituted of a p-type transistor P3, and pre-charges the second latch node SAc at the time of a data readout operation. A gate of the p-type transistor P3 is connected to the pre-charge section selection signal PRCn, drain thereof is connected to the second latch node SAc, and source thereof is connected to the internal power source VDD.

Inverters IN14-1 and IN14-2 are connected in series between the first pre-charge section 22-1 and data output section 17.

1-2-3. Regarding Data Output Section

As shown in FIG. 2, the data output section 17 is constituted of a transistor Tr17, inverter IN17, and multiplexer C17.

A source of the transistor Tr17 is grounded, and drain thereof is connected to the dummy column 11D. An input of the inverter IN17 is connected to a gate of the transistor Tr17, and output thereof is connected to a gate of another transistor Tr17.

The multiplexer C17 outputs readout data of one of the left side region (Left) and right side region (Right) selected by switching carried out by using a column selection signal CA<3> connected to the input of the inverter IN17 to the outside as an output signal DOUT.

2. Data Readout Operation

Next, a data readout operation of the semiconductor memory device according to the first embodiment will be described below by using FIGS. 3 to 6.

2-1. Readout Operation of Data in State "0"

First, a readout operation of data in the state "0" will be described below by using FIGS. 3 and 4. Here, the description will be given in accordance with the timing chart of FIG. 3, and the case where the memory cell MC (cell 0) connected to the word line WL0 shown in FIG. 4 is read will be described as an example.

First, at time t0, the first and second latch nodes (SAc/SAt) are pre-charged. More specifically, a pre-charge selection signal PRCn (n implies a negative signal) of one of the left side region Left and right side region Right on the data reading side from which data is to be read is selected, the first and second pre-charge sections 22-1 and 22-2 are driven, and the current paths of the transistors P3 and P4 are brought into conduction. Further, the first and second latch nodes (SAc/SAt) are pre-charged to, for example, a voltage level of the internal power source VDD. Here, the above-mentioned selection signal PRCn is a global signal, and is a signal which becomes the "L" level when the pre-charge is executed.

Subsequently, at time t1, a voltage relationship between the pre-charge selection signal PRCn and the block selection signal DISTp which are complementary to each other is reversed, and the readout operation is started.

Subsequently, at time t2, the main column decoder 13M outputs a main selection signal CSL0 configured to select the bit line BL0 to the main column selection section MSC. Upon receipt of the main selection signal CSL0, the main column selection section MSC selects the selected bit line BL0.

At time t2 described above, the dummy column decoder 13D outputs a dummy selection signal DCSL configured to select the dummy bit line DBL to the dummy column selection section DSC. Upon receipt of the dummy selection signal DCSL, the dummy column selection section DSC selects the dummy bit line BLdm.

At this time, as shown in FIGS. 3(*d*), 3(*e*), and 4, the dummy readout current control section 15 constituted of the dummy column decoder 13D, and dummy column selection section DSC controls the current value I0$d$(0) of the dummy readout current of the dummy memory cell DMC in such a manner that the current value I0$d$(0) becomes smaller than the current value I0(0) of the readout current in the state "0" of the memory cell MC. More specifically, upon receipt of the dummy selection signal DCSL, the dummy selection transistor DST adjusts the current value I0$d$(0) of the dummy readout current to satisfy the relationship of the following expression (1).

$$I0d(0)(I\text{cell}(\text{Dummy}))<I0(0)(I\text{cell}(0)) \qquad \text{expression (1)}$$

Thereafter, when the word line WL0 is selected by the row decoder 12, the first and second latch nodes (SAt, SAc) of the sense amplifier 14SA which are pre-charged go from the voltage level of the internal power source VDD at substantially the same rate toward the voltage level of the ground potential VSS, and reach a certain intermediate potential.

Subsequently, when the memory cell MC selected by the activated selection word line WL0, and selected bit line BL0 is a cell in the state "0" as in this case, although the memory cell is selected, the other end of the element EL on the source side is grounded, and hence a large cell current I0(0) (Icell(0)) flows through the selected bit line BL0.

On the other hand, on the dummy bit line DBL side, a dummy readout current larger than the current of the current value I0(1) (Icell(1)) flowing through the cell 1, and smaller than the on-current of the normal memory cell MC as shown by the above expression (1) flows. As a result of this, a current larger than that of the dummy bit line BLdm flows through the selected bit line BL0, the voltage level of the first latch node SAt goes toward the ground potential GND side, and the voltage level of the second latch node SAc goes toward the internal power source VDD side.

Subsequently, the voltage levels of the first and second latch nodes SAt and SAc are amplified by the inverters IN14-1 and IN14-2, and are output to the multiplexer C17 of the data output section 17.

Subsequently, the multiplexer C17 outputs readout data of the state "0" of the left side region to the outside as the output signal DOUT by the selection signal CA<3>. For example, the final output signal DOUT is detected as the level "L" of the CMOS level.

Subsequently, at time t3, the voltage relationship between the pre-charge selection signal PRCn and the block selection signal DISTp which are complementary to each other is reversed again, and the "0" data readout operation is terminated.

2-2. Readout Operation of Data in State "1"

Next, a readout operation of data in the state "1" will be described below by using FIGS. 5 and 6. Here, the description will be given in accordance with the timing chart of FIG. 5, and the case where the memory cell MC (cell 1) connected to the word line WL1 shown in FIG. 6 is read will be described as an example.

At time t0, the first and second latch nodes (SAc/SAt) are pre-charged as in the above case. More specifically, a pre-charge selection signal PRCn (n implies a negative signal) of one of the left side region Left and right side region Right on the data reading side from which data is to be read is selected, the first and second pre-charge sections 22-1 and 22-2 are driven, and the current paths of the transistors P3 and P4 are brought into conduction. Further, the first and second latch nodes (SAc/SAt) are pre-charged to, for example, a voltage level of the internal power source VDD.

Subsequently, at time t1, a voltage relationship between the pre-charge selection signal PRCn and the block selection signal DISTp which are complementary to each other is reversed, and the readout operation is started.

Subsequently, at time t2, the main column decoder 13M outputs a main selection signal CSL0 configured to select the bit line BL0 to the main column selection section MSC. Upon receipt of the main selection signal CSL0, the main column selection section MSC selects the selected bit line BL0.

At time t2 described above, the dummy column decoder 13D outputs a dummy selection signal DCSL configured to select the dummy bit line DBL to the dummy column selection section DSC. Upon receipt of the dummy selection signal DCSL, the dummy column selection section DSC selects the dummy bit line BLdm.

At this time, as shown in FIGS. 5(*d*), 5(*e*), and 6, the dummy readout current control section 15 constituted of the dummy column decoder 13D and dummy column selection section DSC controls the current value I0$d$(0) of the dummy readout current of the dummy memory cell DMC in such a manner that the current value I0$d$(0) becomes larger than the current value I0(1) of the readout current in the state "1" of the memory cell MC. More specifically, upon receipt of the dummy selection signal DCSL, the dummy selection transistor DST adjusts the current value I0$d$(0) of the dummy readout current to satisfy the relationship of the following expression (2).

$$I0(1)(I\text{cell}(1))<I0d(0)(I\text{cell}(\text{Dummy})) \qquad \text{expression (2)}$$

Thereafter, when the word line WL1 is selected by the row decoder 12, the first and second latch nodes (SAt, SAc) of the sense amplifier 14SA which are pre-charged go from the voltage level of the internal power source VDD at substantially the same rate toward the voltage level of the ground potential VSS, and reach a certain intermediate potential.

Subsequently, when the memory cell MC selected by the activated selection word line WL0, and selected bit line BL1 is a cell in the state "1" as in this case, although the memory cell is selected, the other end of the element EL on the source side is not grounded, and hence a cell current I0(1) (Icell(1)) hardly flows through the selected bit line BL0.

On the other hand, on the dummy bit line DBL side, a current smaller than the on-current of the normal memory cell MC, and larger than the current flowing through the cell 1 of the current value I0(1) (Icell(1)) as shown by the above expression (2) flows. As a result of this, a current larger than that of the selected bit line BL0 flows through the dummy bit line BLdm, the voltage level of the second latch node SAt goes toward the ground potential GND side, and the voltage level of the first latch node SAc goes toward the internal power source VDD side.

Subsequently, the voltage levels of the first and second latch nodes SAt and SAc are amplified by the inverters IN14-1 and IN14-2, and are output to the multiplexer C17 of the data output section 17.

Subsequently, the multiplexer C17 outputs readout data of the state "1" of the left side region to the outside as the output signal DOUT by the selection signal CA<3>. For example, the final output signal DOUT is detected as the level "H" of the CMOS level.

Subsequently, at time t3, the voltage relationship between the pre-charge selection signal PRCn and the block selection signal DISTp which are complementary to each other is reversed again, and the "1" data readout operation is terminated.

It should be noted that as shown in FIG. 5, the voltage values of the bit line (or the local bit line Local BL) and dummy bit line DBL are constant throughout the entire read operation time, and hence swinging of the voltage can be substantially suppressed.

3. Functional Advantage

According to the semiconductor memory device associated with the first embodiment, and data readout operation thereof, at least the functional advantages of the following items (1) to (3) can be obtained.

(1) Advantage in High-Speed Operation

As described above, the semiconductor memory device according to the first embodiment includes a memory cell array 11 provided with a main memory cell array 11M including a plurality of memory cells MC arranged in a matrix form at intersection positions of at least a plurality of word lines (WL0 to WL15), and a plurality of bit lines (BL0 to BL15), and dummy column 11D including a plurality of dummy memory cells DMC arranged at intersection positions of the plurality of word lines (WL0 to WL15) and dummy bit lines (DBLdm), and sense section 14 provided with a dummy readout current control section 15 (DSC, 13D) for controlling the current value I0*d*(0) of the dummy readout current of the dummy memory cell in such a manner that the current value becomes between the current values of the readout currents in the state "1" and state "0" of the memory cell (I0(1)<I0*d*(0)<I0(0)), and sense amplifier 14SA configured to receive a readout current of the state "1" or state "0" (I0(1) or I0(0)), or dummy readout current (I0*d*(0)) as an input, comparing these currents with each other, and outputting the currents.

Thus, at the time of the "0" data readout operation, as shown in, for example, FIGS. 3(*d*), 3(*e*), and 4, the dummy readout current control section 15 constituted of the dummy column decoder 13D, and dummy column selection section DSC controls the current value I0*d*(0) of the dummy readout current of the dummy memory cell DMC in such a manner that the current value I0*d*(0) becomes smaller than the current value I0(0) of the readout current in the state "0" of the memory cell MC.

At the time of the "1" data readout operation, as shown in, for example, FIGS. 5(*d*), 5(*e*), and 6, the dummy readout current control section 15 constituted of the dummy column decoder 13D, and dummy column selection section DSC controls the current value I0*d*(0) of the dummy readout current of the dummy memory cell DMC in such a manner that the current value I0*d*(0) becomes larger than the current value I0(1) of the readout current in the state "0" of the memory cell MC.

Therefore, according to the configuration described above, it is possible to perform control to satisfy the relationships shown in the above expressions (1) and (2) as follows.

$$I0(1)(I\text{cell}(1))<I0d(0)(I\text{cell}(\text{Dummy}))<I0(0)(I\text{cell}(0))$$

As described above, according to the configuration of the semiconductor memory device, and data readout operation thereof associated with the first embodiment, it is not necessary that data readout should be carried out by the discharge of the selected bit line of the pre-charged bit line (BL0 to BL15). That is, it is possible to detect a difference in driving force between a memory cell readout current and dummy readout current both of which satisfy one of the relationships of the above expressions (1) and (2) by means of the sense amplifier 14SA.

Accordingly, unlike the comparative example to be described later, it is not necessary to carry out data readout by using a current of a memory cell obtained after activating the wiring capacitance of the bit line (for example, junction capacitance of a transistor, wiring capacitance of a local bit line, and wiring capacitance of a main bit line).

For example, a relationship between the number of cells per bit line (number of cells/BL) and a current value (μA) in each of this example and comparative example is as shown in FIG. 7. As shown in FIG. 7, the characteristic line I_E1 according to this example is substantially constant irrespectively of the increase in the number of cells per bit line (number of cells/BL). Conversely, the characteristic line I_C according to the comparative example increases as the number of cells per bit line (number of cells/BL) increases.

Furthermore, for example, a relationship between the number of cells per bit line (number of cells/BL) and operation time (SAt) in each of this example and comparative example is as shown in FIG. 8. As shown in FIG. 8, the characteristic line T_E1 according to this example is substantially constant irrespectively of the increase in the number of cells per bit line (number of cells/BL). Conversely, the characteristic line T_C according to the comparative example increases as the number of cells per bit line (number of cells/BL) increases.

As described above, according to the configuration of this example, and the data readout operation thereof, the charging time and discharge time of the wiring capacitance of the bit line can be made unnecessary, this being advantageous to the high-speed operation.

(2) Advantage in Reduction of Power Consumption

Furthermore, in the above-mentioned configuration, and data readout method, it is possible to make the charging time and discharge time of the wiring capacitance of the bit line unnecessary, and hence there can be obtained a merit of requiring no activation of the wiring capacitance of the bit line (for example, junction capacitance of a transistor, wiring capacitance of a local bit line, and wiring capacitance of a main bit line), and enabling reduction in power consumption.

Moreover, in the sense amplifier 14SA, the first latch node SAt to which a readout current in the state "0" or state "1" is input, and second latch node SAc to which a dummy readout current is input are pre-charged before the data readout operation is carried out (time t1, t2).

More specifically, for example, at time t0 in FIGS. 3 and 5, a pre-charge selection signal PRCn (n implies a negative signal) of one of the left side region Left and right side region Right on the data reading side from which data is to be read is selected, the first and second pre-charge sections 22-1 and 22-2 are driven, and the current paths of the transistors P3 and P4 are brought into conduction. Further, the first and second latch nodes (SAc/SAt) are pre-charged to, for example, a voltage level of the internal power source VDD.

As described above, the current consumed at the time of the data readout operation is utilized only to drive the first and second latch nodes (SAc/SAt) of the sense amplifier 14SA. Accordingly, it is possible to make the consumption current very small, this being advantageous to significant reduction in power consumption.

Further, the capacitance to be charged by the current of the cell, or the capacitance to be discharged is only that of the first and second latch nodes (SAc/SAt), and source node of the sense amplifier 14SA. It can be said that the above is also advantageous to a high-speed operation.

(3) Ability to Prevent Malfunction of Sense Amplifier 14SA, and Improve Reliability As described above, in the configuration according to this example, the memory cell MC is constituted of a memory transistor MTr and element EL of two terminals. A gate of the memory transistor MTr is connected to one of the word lines (ML0 to WL15), and drain thereof is connected to one of the bit lines (BL0 to BL15). The element EL is connected to a source of the memory transistor MTr at one end thereof, and is connected to the ground potential (GND) at the other end thereof. The configuration of the dummy memory cell DMC is identical with the memory cell.

As described above, the memory cell MC and dummy memory cell DMC are configured in such a manner that the drain side of the current path of each of the memory cell MC and dummy memory cell DMC is directly connected to one of the bit lines (BL0 to BL15) not through the element EL, and hence it is possible to equalize the drain capacitance of the memory cell connected to one bit line (BL0 to BL15) among the data codes.

Accordingly, even when a memory cell MC at a deeply inner position remote from the sense amplifier 14SA is to be read, it is possible to equalize the drain capacitance, prevent a malfunction of the sense amplifier from being caused, and improve the reliability, this being advantageous.

Second Embodiment

Other Configuration Examples

Next, a semiconductor memory device, and data readout operation thereof according to a second embodiment will be described below by using FIGS. 9 to 13. This embodiment relates to other configuration examples. In this description, a detailed description of parts overlapping the first embodiment will be omitted.

Configuration Examples

First, a configuration example of the semiconductor memory device according to the second embodiment will be described below by using FIG. 9.

As shown in FIG. 9, the semiconductor memory device according to this example differs from the first embodiment in the point that an element EL is provided on the drain side of a memory cell MC (and dummy memory cell DMC).

That is, a gate of a memory transistor MTr is connected to one of word lines (WL0 to WL15), drain thereof is connected to one end of the element EL, and source thereof is connected to the ground potential (GND). The other end of the element EL is connected to one of bit lines (BL0 to BL15). The configuration of a dummy memory cell DMC is identical with the memory cell.

It should be noted that as to the wiring capacitance of the bit line, for example, the wiring capacitance CM, CD of the local bit line BL0, and dummy bit line DBL0, and wiring capacitance of the wiring resistances RM, RD, and the main bit line are shown in FIG. 9.

Other configurations are substantially identical with the first embodiment, and hence a detailed description of them will be omitted.

<Data Readout Operation>

Next, a data readout operation of the semiconductor memory device according to the second embodiment will be described below by using FIGS. 10 to 13. FIG. 10 is a view showing both the "0" data readout operation and "1" data readout operation.

Readout Operation of Data in State "0"

First, a readout operation of data in the state "0" will be described below by using FIG. 11. Here, a case where a memory cell (cell 0) connected to the word line WL0 is read will be described as an example.

First, at time t0, first and second latch nodes (SAc/SAt) are pre-charged. More specifically, a pre-charge selection signal PRCn (n implies a negative signal) of one of the left side region Left and right side region Right on the data reading side from which data is to be read is selected, the first and second pre-charge sections 22-1 and 22-2 are driven, and the current paths of the transistors P3 and P4 are brought into conduction. Further, the first and second latch nodes (SAc/SAt) are pre-charged to, for example, a voltage level of the internal power source VDD.

Subsequently, at time t2, a main column decoder 13M outputs a main selection signal CSL0 configured to select the bit line BL0 to a main column selection section MSC. Upon receipt of the main selection signal CSL0, the main column selection section MSC selects the selected bit line BL0.

At time t2 described above, a dummy column decoder 13D outputs a dummy selection signal DCSL configured to select the dummy bit line DBL to a dummy column selection section DSC. Upon receipt of the dummy selection signal DCSL, the dummy column selection section DSC selects the dummy bit line BLdm.

At this time, in the same manner as described previously, the dummy readout current control section 15 constituted of the dummy column decoder 13D, and dummy column selection section DSC controls the current value I0*d*(0) of the dummy readout current of the dummy memory cell DMC in such a manner that the current value I0*d*(0) becomes smaller than the current value I0(0) of the readout current in the state "0" of the memory cell MC. More specifically, upon receipt of the dummy selection signal DCSL, a dummy selection transistor DST adjusts the current value I0*d*(0) of the dummy readout current to satisfy the relationship of the previous expression (1).

Thereafter, when the word line WL0 is selected by a row decoder 12, the first and second latch nodes (SAt, SAc) of a sense amplifier 14SA which are pre-charged go from the voltage level of the internal power source VDD at substantially the same rate toward the voltage level of the ground potential VSS, and reach a certain intermediate potential.

Subsequently, when the memory cell MC selected by the activated selected word line WL0, and selected bit line BL0 is a cell in the state "0" as in this case, although the memory cell is selected, one end of the element EL on the source side is grounded, and hence a large cell current I0(0) (Icell(0)) flows through the selected bit line BL0.

On the other hand, on the dummy bit line DBL side, a dummy readout current larger than the current of the current value I0(1) (Icell(1)) flowing through the cell 1, and smaller than the on-current of the normal memory cell MC as shown by the previous expression (1) flows. As a result of this, a current larger than that of the dummy bit line BLdm flows through the selected bit line BL0, the voltage level of the first latch node SAt goes toward the ground potential GND side, and the voltage level of the second latch node SAc goes toward the internal power source VDD side.

Subsequently, the voltage levels of the first and second latch nodes SAt and SAc are amplified by the inverters IN14-1 and IN14-2, and are output to a multiplexer C17 of a data output section 17.

Subsequently, the multiplexer C17 outputs readout data of the state "0" of the left side region to the outside as the output signal DOUT by the selection signal CA<3>. For example, the final output signal DOUT is detected as the level "L" of the CMOS level.

Readout Operation of Data in State "1"

Next, a readout operation of data in the state "1" will be described below by using FIG. 12. Here, the case where the memory cell MC (cell 1) connected to the word line WL3 is read will be described as an example.

At time t7, the first and second latch nodes (SAc/SAt) are pre-charged as in the above case. More specifically, a pre-charge selection signal PRCn (n implies a negative signal) of one of the left side region Left and right side region Right on the data reading side from which data is to be read is selected, the first and second pre-charge sections 22-1 and 22-2 are driven, and the current paths of the transistors P3 and P4 are brought into conduction. Further, the first and second latch nodes (SAc/SAt) are pre-charged to, for example, a voltage level of the internal power source VDD.

Subsequently, at time t7, the main column decoder 13M outputs a main selection signal CSL0 configured to select the bit line BL0 to the main column selection section MSC. Upon receipt of the main selection signal CSL0, the main column selection section MSC selects the selected bit line BL0.

At time t7 described above, the dummy column decoder 13D outputs a dummy selection signal DCSL configured to select the dummy bit line DBL to the dummy column selection section DSC. Upon receipt of the dummy selection signal DCSL, the dummy column selection section DSC selects the dummy bit line BLdm.

At this time, the dummy readout current control section 15 constituted of the dummy column decoder 13D and dummy column selection section DSC controls the current value I0*d* (0) of the dummy readout current of the dummy memory cell DMC in such a manner that the current value I0*d*(0) becomes larger than the current value I0(1) of the readout current in the state "1" of the memory cell MC. More specifically, upon receipt of the dummy selection signal DCSL, the dummy selection transistor DST adjusts the current value I0*d*(0) of the dummy readout current to satisfy the relationship of the previous expression (2).

Thereafter, when the word line WL3 is selected by the row decoder 12, the first and second latch nodes (SAt, SAc) of the sense amplifier 14SA which are pre-charged go from the voltage level of the internal power source VDD at substantially the same rate toward the voltage level of the ground potential VSS, and reach a certain intermediate potential.

Subsequently, when the memory cell MC selected by the activated selected word line WL0, and selected bit line BL1 is a cell in the state "1" as in this case, although the memory cell is selected, one end of the element EL on the source side is not grounded, and hence a cell current I0(1) (Icell(1)) hardly flows through the selected bit line BL0.

On the other hand, on the dummy bit line DBL side, a current smaller than the on-current of the normal memory cell MC, and larger than the current flowing through the cell 1 of the current value I0(1) (Icell(1)) as shown by the previous expression (2) flows. As a result of this, a current larger than that of the selected bit line BL0 flows through the dummy bit line BLdm, the voltage level of the second latch node SAt goes toward the ground potential GND side, and the voltage level of the first latch node SAc goes toward the internal power source VDD side.

Subsequently, the voltage levels of the first and second latch nodes SAt and SAc are amplified by the inverters IN14-1 and IN14-2, and are output to the multiplexer C17 of the data output section 17.

Subsequently, the multiplexer C17 outputs readout data of the state "1" of the left side region to the outside as the output signal DOUT by the selection signal CA<3>. For example, the final output signal DOUT is detected as the level "H" of the CMOS level.

Further, the voltage relationship between the bit line (BL0 to BL15) and dummy bit line DBL is as shown in FIG. 13. As shown in FIG. 13, the voltage values of the bit line (or the local bit line Local BL) and dummy bit line DBL are constant throughout the entire read operation time, and hence swinging of the voltage can be substantially suppressed.

<Functional Advantage>

According to the semiconductor memory device associated with the second embodiment, at least the same functional advantages as above items (1) and (2) can be obtained. Furthermore, it is possible to apply the configuration and data readout operation according to this example as the need arises.

Comparative Example

Example in which Bit Line Voltage is Changed to be Read

Figure 15:
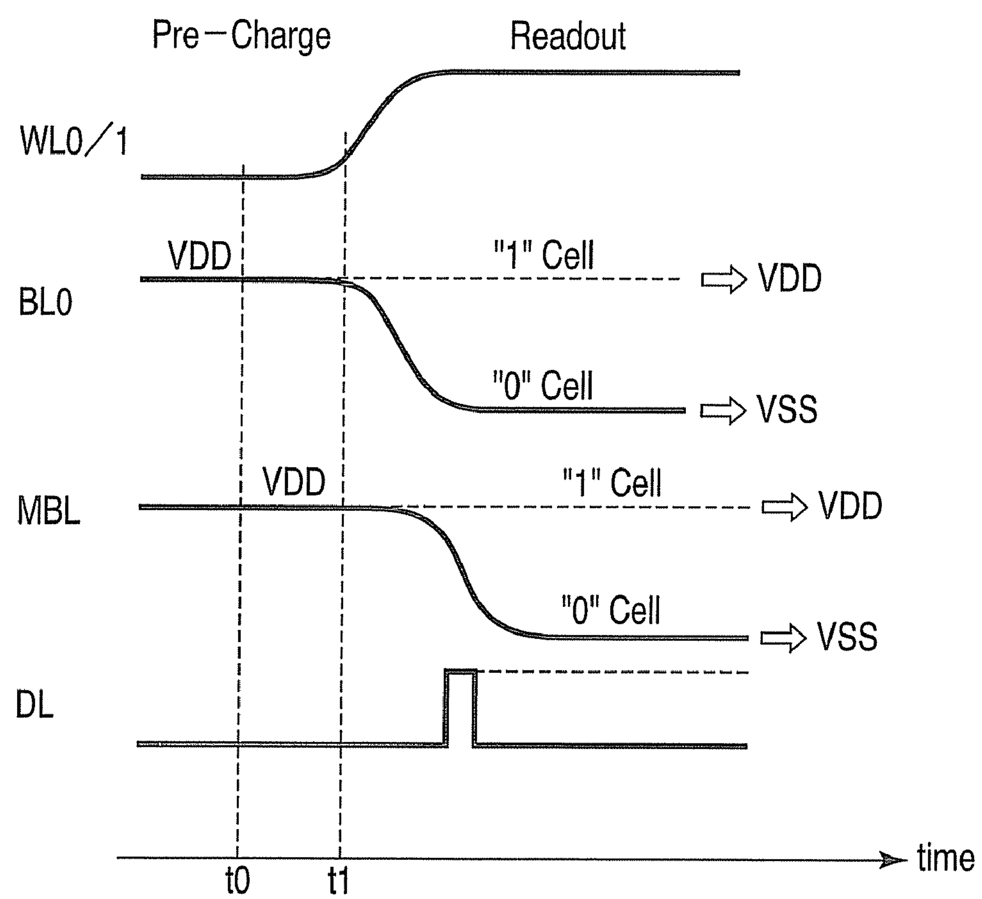
FIG. 15 is a timing chart showing a data readout operation according to the comparative example.

Next, in order to make a comparison with the semiconductor memory device and data readout operation according to each of the first and second embodiments, a semiconductor memory device and data readout operation according to a comparative example will be described below by using FIGS. 14 and 15. The comparative example relates to an example in which a bit line is pre-charged, and the potential of the discharged bit line is caused to make a transition, whereby data is read. In the description, a detailed description of parts overlapping the first embodiment will be omitted. It should be noted that this comparative example is an example for clarifying the point thereof different from the first and second embodiments in comparison with the first and second embodiments, and shows the knowledge acquired by the inventor of the present invention in the process of contriving the present invention.

Configuration Example

A configuration example according to the comparative example will be described below by using FIG. 14. Here, a memory cell array 111 of the semiconductor memory device according to the comparative example is shown.

As shown in FIG. 14, the memory cell array 111 according to the comparative example is provided with a plurality of word lines (WL0 to WL15) and bit lines (BL) arranged in a grid-like pattern, and NMOS transistors Tr and elements EL arranged at intersection positions of the word lines and bit lines. A source of the transistor Tr is grounded, and gate thereof is connected to a word line (WL0 to WL15). A memory cell MC a drain of which is not connected to a bit line BL is regarded as a cell "1", and a memory cell a drain of which is connected to a bit line BL is regarded as a cell "0".

The memory cell array 111 is further provided with a transistor a drain of which is connected to one end of a bit line BL, and a gate of which is connected to a column selection signal configured to select a bit line BL, an NMOS transistor (keeper transistor) for keeping the BL potential, connected to a node on the source node side of this selector transistor (hereinafter, the node is referred to as MBL), and amplifier (IN11, IN12) which uses the node MBL as the input, and carries out amplification of 0 (GND) level-VDD level in accordance with the level of the node MBL.

<Data Readout Operation>

Next, a data readout operation of the semiconductor memory device according to the comparative example will be described below by using FIG. 15. Here, the case where the word lines WL0 and WL1 in FIG. 14 are read will be described as an example.

Here, a first half of the readout operation, i.e., the operation from the selection of the word lines WL0 and WL1 to the swing of the bit line is an operation common to the cell "0" and cell "1", and hence a description will be given without distinction of the type of cell.

At time t0, in the initial stage of the readout operation, both the bit line BL and main bit line MBL are pre-charged to the internal power source voltage (VDD) level. In this stage, the state where no word line and no bit line are selected is observed.

Subsequently, at time t1, one column selection line is first selected, and the gate electrode is set to the selection level, whereby one bit line BL is selected, and a path from the bit line BL to the main bit MBL and sense amplifier is formed. Subsequently to this, one of the word lines WL0 and WL1 is selected, whereby the operation is branched as will be described below depending on whether the selected cell is a cell "0" or cell "1".

Case where Selected Cell is Cell "1"

In the case where the selected cell is a cell "1", when the word line WL1 is selected, and the cell is activated, there is no connection between the bit line BL0 and the drain terminal of the memory cell MC, and hence a discharge operation of the bit line BL0 does not occur. As a result of this, the bit line BL0 is kept in the state where it is held at the internal power source voltage (VDD) level. Accordingly, both the potential of the main bit line MBL, and potential of data line DL are kept in the state where the potentials are held at the internal power source voltage (VDD) level, and output data as the level "H" is output to the outside.

Case where Selected Cell is Cell "0"

In the case where the selected cell is a cell "0", when the word line WL0 is selected, and the cell is activated, by virtue of the presence of the connection between the bit line BL0 and the drain terminal of the cell, a discharge operation of the bit line BL0 is carried out by the on-current of the selected cell. Accordingly, both the potential of the main bit line MBL, and potential of the data line DL are caused to make a transition from the internal power source voltage (VDD) level to the ground potential (VSS) level, and output data as the level "L" is output to the outside.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:

a memory cell array provided with a main memory cell array including a plurality of memory cells, and a dummy column including a plurality of dummy memory cells;

a dummy readout current control section configured to control a current value of a dummy readout current of the dummy memory cell in such a manner that the current value becomes between the current values of the readout currents in first and second states of the memory cell; and a sense section provided with a sense amplifier configured to receive a readout current in one of the first and second states, or dummy readout current as an input, comparing these currents with each other, and outputting the currents.

2. The device of claim 1, wherein the memory cells are arranged at intersection positions of a plurality of word lines, and a plurality of bit lines in a matrix form, and the dummy memory cells are arranged at intersection positions of the plurality of word lines and a plurality of dummy bit lines in a matrix form.

3. The device of claim 2, wherein the memory cell is constituted of a transistor a gate of which is connected to a word line, and a drain of which is connected to a bit line, and an element with two terminals one end of which is connected to a source of the transistor, and the other end of which is connected to a reference power source, and the case where the two terminals of the element are short-circuited is defined as the first state, and a readout current in the case where a part between the two terminals of the element is opened is defined as a readout current in the second state.

4. The device of claim 3, wherein the dummy memory cell is of the same configuration common to both the memory cell and dummy memory cell, and is configured in such a manner that the two terminals of the element are short-circuited.

5. The device of claim 3, wherein in the sense amplifier, a first latch node to which a readout current in the first state or second state is input, and a second latch node to which a dummy readout current is input are pre-charged before a data readout operation is carried out.

6. The device of claim 2, wherein at the time of data readout, the bit line and dummy bit line are fixed at the reference power source.

7. The device of claim 2, wherein the dummy readout current control section comprises:

a switching element in which one end of a current path is connected to the dummy bit line, and the other end of the current path is connected to the sense amplifier; and a dummy column decoder configured to control a value of a current flowing through the current path of the switching element by controlling a voltage to be applied to a gate of the switching element.

8. The device of claim 2 further comprising a main column decoder configured to select one of a plurality of bit lines of the main column decoder.

9. The device of claim 2 further comprising:

a row decoder configured to select one of the word lines of the memory cell array; and a data output section an input of which is connected to the sense section, an output of which is connected to an output terminal, and which outputs readout data from the sense section to the outside.

10. A semiconductor memory device comprising:

a memory cell array provided with a main memory cell array including a plurality of memory cells arranged at intersection positions of a plurality of word lines and a plurality of bit lines, and a dummy column including a plurality of dummy memory cells arranged at intersection positions of the plurality of word lines and a plurality of dummy bit lines;

a dummy readout current control section configured to control a current value of a dummy readout current of the dummy memory cell in such a manner that the current value becomes between the current values of the readout currents in first and second states of the memory cell; and a sense section provided with a sense amplifier configured to receive a readout current in one of the first and second states, or dummy readout current as an input, comparing these currents with each other, and outputting the currents, wherein the memory cell is constituted of a transistor a gate of which is connected to a word line, a drain of which is connected to a bit line through an element with two terminals, and a source of which is connected to a reference power source, and the case where the two terminals of the element are short-circuited is defined as the first state, and a readout current in the case where a part between the two terminals of the element is opened is defined as a readout current in the second state.

11. The device of claim 10, wherein the dummy memory cell is of the same configuration common to both the memory cell and dummy memory call, and is configured in such a manner that the two terminals of the element are short-circuited.

12. The device of claim 10, wherein in the sense amplifier, a first latch node to which a readout current in the first state or second state is input, and a second latch node to which a dummy readout current is input are pre-charged before a data readout operation is carried out.

13. The device of claim 10, wherein at the time of data readout, the bit line and dummy bit line are fixed at the reference power source.

14. The device of claim 10, wherein the dummy readout current control section comprises:

a switching element in which one end of a current path is connected to the dummy bit line, and the other end of the current path is connected to the sense amplifier; and a dummy column decoder configured to control a value of a current flowing through the current path of the switching element by controlling a voltage to be applied to a gate of the switching element.

15. The device of claim 10 further comprising a main column decoder configured to select one of a plurality of bit lines of the main column decoder.

16. The device of claim 10 further comprising:

a row decoder configured to select one of the word lines of the memory cell array; and a data output section an input of which is connected to the sense section, an output of which is connected to an output terminal, and which outputs readout data from the sense section to the outside.

* * * * *